United States Patent
Hayakawa

(10) Patent No.: US 7,528,870 B2
(45) Date of Patent: *May 5, 2009

(54) IMAGE PICKUP APPARATUS WITH FILTER ON INCIDENT SIDE OF IMAGE PICKUP REGION

(75) Inventor: Shingo Hayakawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/872,157

(22) Filed: Oct. 15, 2007

(65) Prior Publication Data

US 2008/0036903 A1 Feb. 14, 2008

Related U.S. Application Data

(63) Continuation of application No. 10/387,425, filed on Mar. 14, 2003, now Pat. No. 7,479,997.

(30) Foreign Application Priority Data

Apr. 11, 2002 (JP) .............................. 2002-109347

(51) Int. Cl.
*H04N 3/14* (2006.01)
(52) U.S. Cl. ..................................... 348/272; 348/273
(58) Field of Classification Search ................. 348/270, 348/290
See application file for complete search history.

(56) References Cited

U.S. PATENT DOCUMENTS

| | | | | |
|---|---|---|---|---|
| 3,971,065 A | 7/1976 | Bayer | ........................... | 358/41 |
| 4,011,016 A * | 3/1977 | Layne et al. | ................. | 356/402 |
| 4,527,189 A | 7/1985 | Ooi et al. | ..................... | 348/290 |
| 4,680,504 A | 7/1987 | Helvy et al. | ................. | 313/524 |
| 4,865,405 A * | 9/1989 | Kageyama | .................. | 359/359 |
| 5,249,076 A | 9/1993 | Fujiwara et al. | ............. | 359/350 |
| 5,965,875 A | 10/1999 | Merrill | ....................... | 250/226 |
| 6,230,046 B1 | 5/2001 | Crane et al. | .................. | 600/476 |
| 6,342,460 B1 | 1/2002 | Akimoto et al. | ............... | 501/55 |
| 6,391,462 B1 | 5/2002 | Jang | ........................... | 428/432 |
| 6,727,521 B2 * | 4/2004 | Merrill | ......................... | 257/98 |
| 6,903,036 B2 | 6/2005 | Akimoto et al. | ............... | 501/12 |
| 6,930,336 B1 * | 8/2005 | Merrill | ....................... | 348/272 |

(Continued)

FOREIGN PATENT DOCUMENTS

JP  62-133772  6/1987

(Continued)

OTHER PUBLICATIONS

Japanese Office Action issued Jun. 20, 2008, in Japanese Application No. 2002-109347.

*Primary Examiner*—David L Ometz
*Assistant Examiner*—Luong T Nguyen
(74) *Attorney, Agent, or Firm*—Fitzpatrick, Cella, Harper & Scinto

(57) ABSTRACT

An image pickup apparatus includes an image pickup region in which a plurality of pixels are arranged, each pixel including a plurality of photoelectric conversion portions disposed in the depth direction of a semiconductor; and a filter which is disposed on the incident side of the image pickup region and which has a characteristic wherein the transmittance of light in the visible wavelength region decreases as the wavelength of light becomes longer.

4 Claims, 12 Drawing Sheets

U.S. PATENT DOCUMENTS

| | | | |
|---|---|---|---|
| 7,310,113 B2 * | 12/2007 | Yasuda | 348/230.1 |
| 2001/0005278 A1 | 6/2001 | Onomichi et al. | 359/350 |
| 2003/0020887 A1 | 1/2003 | Hasegawa | 353/122 |

FOREIGN PATENT DOCUMENTS

| JP | 7-74340 | 3/1995 |
|---|---|---|
| JP | 10-101370 | 4/1998 |
| JP | 2000-313636 | 11/2000 |

\* cited by examiner

IMAGE PICKUP APPARATUS WITH FILTER ON INCIDENT SIDE OF IMAGE PICKUP REGION

The present application is a continuation of U.S. application Ser. No. 10/387,425 filed Mar. 14, 2003, pending.

BACKGROUND OF THE INVENTION

1. Field of the Invention

The present invention relates to an image pickup apparatus for imaging an object.

2. Description of the Related Art

A first known art, disclosed in U.S. Pat. No. 3,971,065, is the most general known art used for taking a color image signal output from an image pickup device. This official gazette discloses a configuration in which an absorptive material, which selectively absorbs light in a specific wavelength range, is disposed on individual pixels forming an image pickup device so that a photoelectric signal corresponding to a color signal is output. Further, in this known art, this absorptive material is arranged in a two-dimensional mosaic pattern so that a color image signal is generated.

On the other hand, various ideas for a configuration for outputting photoelectric signals corresponding to a plurality of color signals from a pixel are suggested.

Japanese Patent Laid-Open No. 7-074340 discloses an image pickup device including a plurality of photoelectric conversion layers which are disposed at different depths from the surface of a semiconductor substrate and which are electrically separated each other, the image pickup device outputting photoelectric conversion signals corresponding to different spectral sensitivities from a pixel. In this second known art, a plurality of photosensitive layers are formed at different depths from the surface of the semiconductor substrate such that the layers are insulated by a p-type impurity region. By adequately setting the positions of these photosensitive layers, a desired color signal can be output.

Also, a third known art, U.S. Pat. No. 5,965,875, discloses a two-dimensional image sensor of a three-layer photodiode structure, in which a photodiode is formed in a triple-well structure. In this third known art, an n-type layer, a p-type layer, and an n-type layer are formed in this order on the surface of a p-type silicon substrate so that a pn-junction diode forms a three-layered photoelectric conversion region in the depth direction of silicon.

In the first known art, the transmittance in a specific wavelength region in the visible wavelength region can be increased by selectively absorbing light in the specific wavelength region. However, a suitable material which absorbs light in the infrared wavelength region other than the visible wavelength region at the same time is difficult to find. Thus, an optical filter having a function of blocking light in the infrared wavelength region has been generally used in combination. As the optical filter, a dichroic mirror including a dielectric multilayer film evaporated on a transparent substrate or a filter in which the spectral characteristic is adjusted by changing material composition as disclosed in Japanese Patent Laid-Open No. 10-101370 has been used. Also, in the second or third known art, a photoelectric signal is output for light in a wide wavelength region from the visible wavelength region to the near infrared wavelength region according to the photoelectric conversion characteristic of the semiconductor. Thus, an optical filter for blocking light in the infrared wavelength region has been needed.

In the first known art, an absorptive material, having a spectral sensitivity for allowing light in a desired wavelength region to pass through corresponding to a color signal, is disposed for each pixel, and a plurality of types of absorptive material are disposed in a mosaic pattern. Accordingly, a two-dimensional image for each color is formed so that a color image is generated. At this time, each color signal is discrete according to the arrangement of the absorptive material, and thus interpolating must be performed by using the color signal of an adjoining pixel. As a result, a finally generated image has an advantage in that a desired spectral sensitivity of each color signal can be obtained. However, the contrast of color signals decreases and a false-color signal is disadvantageously generated.

In the second and third known arts, the configuration of an image pickup device for outputting a plurality of color signals from a pixel is disclosed in order to solve the problems of the first known art. In these known arts, the problems of the contrast of color signals and generation of a false-color signal can be solved, but it is difficult to obtain a desired spectral characteristic of each color. As a result, it becomes difficult to generate a color signal of a taken image similar to the color signal of an object which has been observed by a user, when a color image is generated.

SUMMARY OF THE INVENTION

It is an object of the present invention to favorably reproduce the color of a taken image by obtaining a favorable spectral sensitivity characteristic of a photoelectric conversion signal which is output from each photoelectric conversion layer.

In order to achieve the above-described object, an image pickup apparatus of the present invention comprises an image pickup region in which a plurality of pixels are arranged, each pixel including a plurality of photoelectric conversion portions disposed in the depth direction of a semiconductor; and a filter which is disposed on the incident side of the image pickup region and which has a characteristic wherein the transmittance of light in the visible wavelength region decreases as the wavelength of light becomes longer.

Further objects, features, and advantages of the present invention will become apparent from the following description of the preferred embodiments with reference to the attached drawings.

DESCRIPTION OF THE PREFERRED EMBODIMENTS

Figure 1:
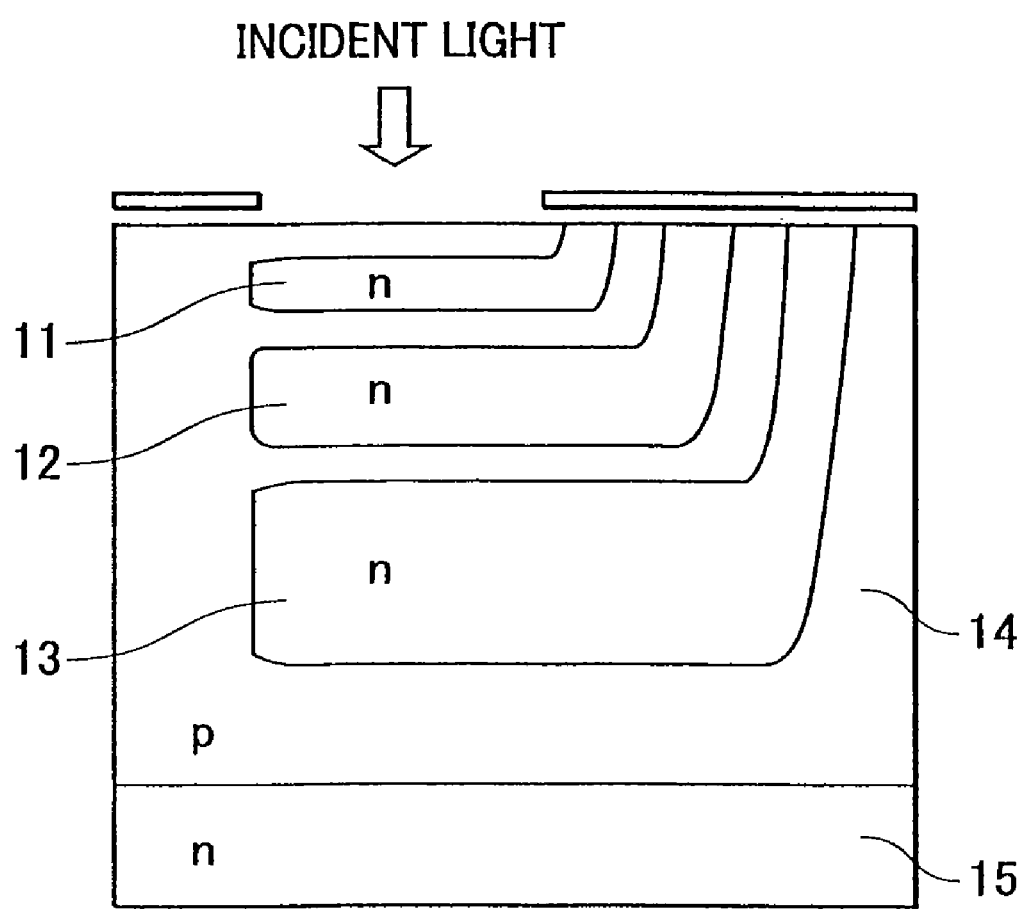
FIG. 1 is a cross-sectional view showing an image pickup device according to a first embodiment of the present invention.

First, common features of the following first and second embodiments will be described. An image pickup device includes a plurality of photosensitive regions having photoelectric conversion layers, which are positioned at different depths from the surface of a semiconductor substrate and which are electrically separated from each other. By using the principle that the probability of generation of a signal charge according to the distance in the depth direction from the surface of the semiconductor substrate changes depending on the wavelength of light entering the substrate, photoelectric conversion signals having different spectral sensitivity characteristics can be output from one pixel. At a small depth from the surface of the semiconductor substrate, the probability of charge generation caused by light of short wavelength is relatively high, and at a large depth, the probability of charge generation caused by light of long wavelength is relatively high. This image pickup device outputs photoelectric signals having different spectral sensitivity characteristics by using such features. However, even at a very small depth from the surface of the semiconductor substrate, a charge generated at this position contains not only a charge generated by short-wavelength light but also a charge which is generated by long-wavelength light at a substantial ratio. This phenomenon occurs depending on the characteristics of the semiconductor substrate.

A filter which will be described in the following first and second embodiments is characterized in that, in the charge generated in a photoelectric conversion layer disposed at a relatively small depth from the surface of the semiconductor substrate, the ratio of charge generated by short-wavelength light is increased by setting the spectral characteristic of light rays entering the semiconductor in the above-described manner. By using such a filter in combination, a color signal having a spectral sensitivity which is close to the relative sensitivity for blue among the spectrum tristimulus values of the human eye can be output.

Preferably, the filter according to the first and second embodiments has a characteristic satisfying the following conditional expression, wherein the transmittance at a wavelength of 450 nm is represented by T1, the transmittance at a wavelength of 550 nm is represented by T2, and the transmittance at a wavelength of 650 nm is represented by T3:

$$T1 > 0.7 > T2 > 0.2 > T3 \tag{1}$$

The conditional expression (1) defines the range of the spectral transmittance of the filter with respect to three typical wavelengths in the visible wavelength region. According to this expression, the transmittance for the three typical wavelengths in the visible wavelength region decreases as the wavelength becomes longer. Also, with this conditional expression, the transmittance at each wavelength is defined to an adequate value.

As described above, in a charge output from a photoelectric conversion layer disposed at a relatively small depth from the surface of the semiconductor substrate, a substantial ratio of charge generated by light of a relatively long wavelength in the visible wavelength region is also contained. By setting the spectral characteristics of the optical filter such that the conditional expression (1) is satisfied, a color signal having a spectral sensitivity close to the relative sensitivity for blue among the spectrum tristimulus values of the human eye can be output. If the value of T2 or T3 in the conditional expression (1) is increased, the desired spectral sensitivity cannot be obtained. On the other hand, if the value of T2 or T3 is decreased, the output signal for a color signal having a spectral sensitivity for a relatively long wavelength in the visible wavelength region is reduced, and noise becomes significant.

Incidentally, the filter according to the first and second embodiments can be realized by using a dielectric multilayer film evaporated on a transparent substrate or a material which absorbs light in a predetermined wavelength region, or by combining these elements.

First Embodiment

FIG. 1 is a cross-sectional view showing an image pickup device used for an image pickup apparatus according to the first embodiment. In a p-type impurity region on an n-type semiconductor substrate, photoelectric conversion regions 11, 12, and 13 are formed at different depths from the surface, each of the regions 11, 12, and 13 including an n-type impurity region. Each of the photoelectric conversion regions 11, 12, and 13 is connected to the surface of a pixel so as to read out an output charge. However, these reading portions are optically shielded. That is, an opening of this pixel is limited to the portion where the photoelectric conversion regions 11, 12, and 13 are stacked in the direction perpendicular to the surface of the semiconductor. Light entering through the upper portion of the photoelectric conversion region 11 is attenuated while generating a charge according to a probability distribution depending on wavelength in each of the photoelectric conversion regions 11, 12, and 13 and the other regions inside the semiconductor substrate.

When the depth from the surface of the semiconductor substrate is represented by X and the absorption coefficient is represented by $\alpha$, the light intensity $I(X)$ at the depth X is expressed as follows:

$$I(X) = I_0 \exp(-\alpha \cdot X) \tag{2}$$

Herein, $I_0$ stands for the light intensity at the surface of the semiconductor substrate.

The absorption coefficient $\alpha$ of the silicon substrate significantly changes according to wavelength, and rapidly decreases as the wavelength becomes longer. Accordingly, short-wavelength light is rapidly attenuated at a relatively small depth from the surface of the semiconductor substrate. On the other hand, long-wavelength light is gradually attenuated.

Figure 2:
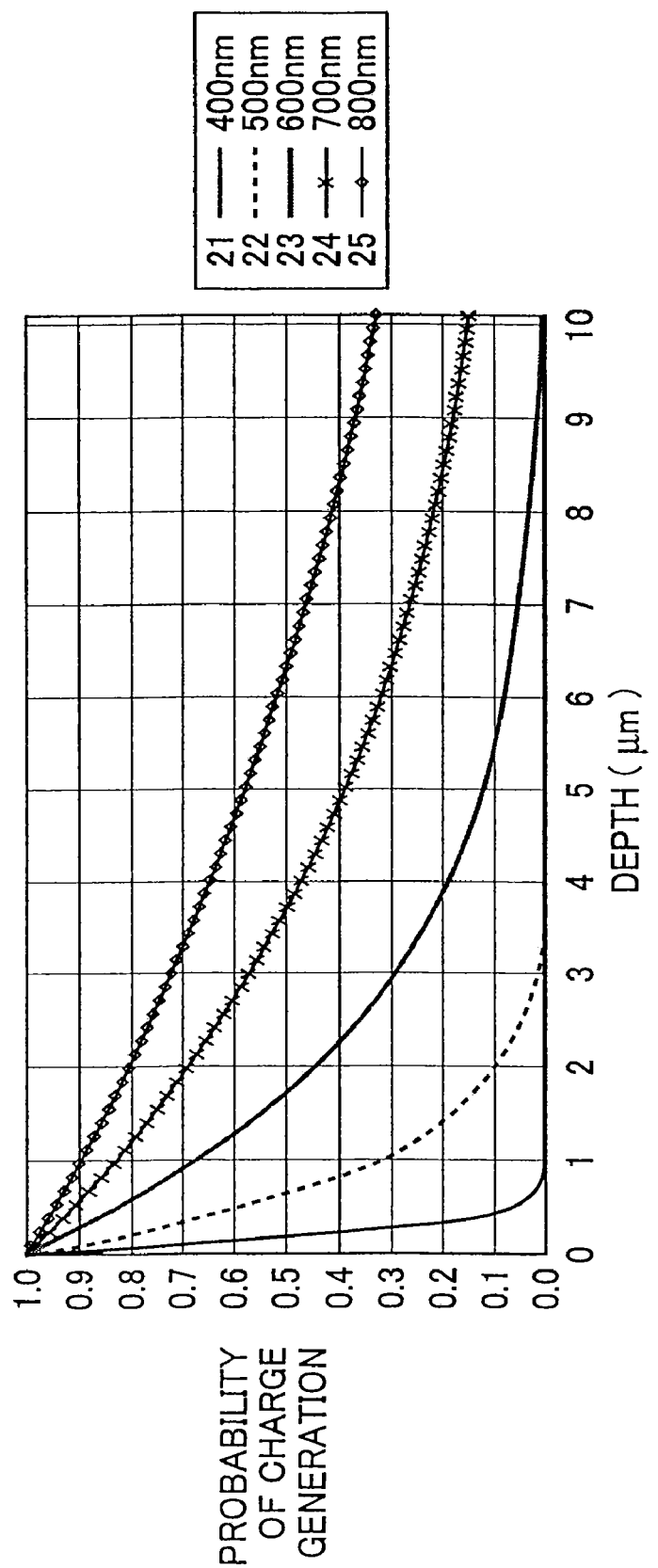
FIG. 2 shows the probability of charge generation according to a depth of a silicon substrate.

FIG. 2 shows the probability of charge generation caused by light of each wavelength in accordance with the depth of the silicon substrate. In the figure, 21, 22, 23, 24, and 25 denote the probability of generation of a signal charge caused by wavelengths of 400 nm, 500 nm, 600 nm, 700 nm, and 800 nm, respectively. Herein, the light intensity $I_0$ at the surface of the semiconductor substrate is normalized to 1.

When photoelectric conversion layers are formed at predetermined positions in the depth direction of the semiconductor substrate, the signal charge amount G(X, λ) which is generated by light of wavelength λ is expressed as follows:

$$G(X,\lambda) = k \cdot \lambda \cdot \{1 - \exp(-\alpha \cdot X)\} \quad (3)$$

In expression (3), k represents a proportionality constant.

Figure 3:
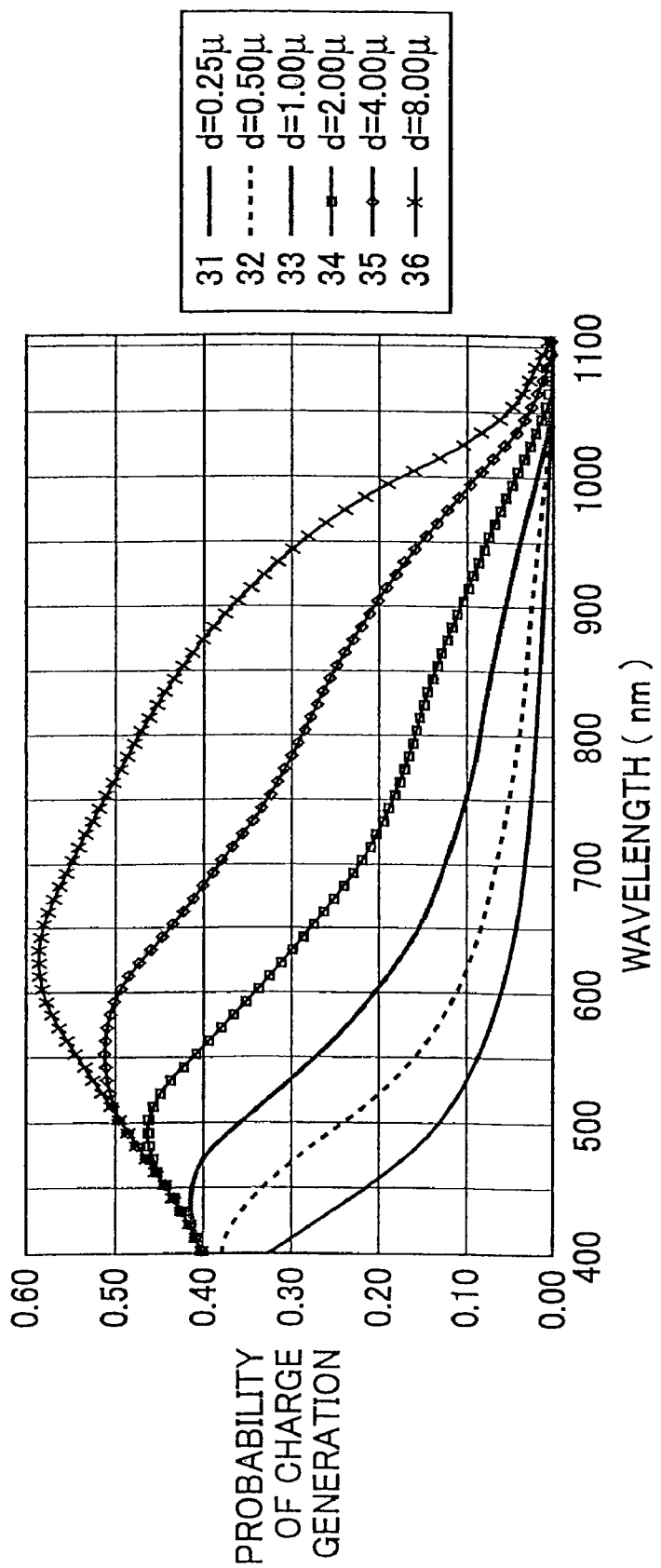
FIG. 3 shows the probability of generation of signal charge according to wavelength.

FIG. 3 shows the probability of generation of a signal charge versus wavelength when the silicon substrate is formed to a predetermined depth. In the figure, 31, 32, 33, 34, 35, and 36 denote the probability of generation of a signal charge at positions at depths of 0.25 μm, 0.5 μm, 1.0 μm, 2.0 μm, 4.0 μm, and 8.0 μm, respectively.

When the photoelectric conversion layers are formed in the silicon substrate in this manner, the wavelength-dependency of the probability of generation of a signal charge changes according to the depth. By using this characteristic, a plurality of photoelectric conversion layers are formed at adequate regions in the depth direction of the silicon substrate so that signal outputs corresponding to different spectral sensitivities can be provided.

When a photoelectric conversion layer is formed in a region from $X_1$ to $X_2$ in the depth direction of the silicon substrate, the probability P(λ) of generation of a signal charge generated in this region is expressed as follows:

$$P(\lambda) = G(X_2, \lambda) - G(X_1, \lambda) = k \cdot \lambda \cdot \{\exp(-\alpha \cdot X_2) - \exp(-\alpha \cdot X_1)\} \quad (4)$$

Herein, by adequately setting the positions $X_1$ and $X_2$ in the depth direction of the silicon substrate, photoelectric conversion layers having various spectral sensitivities can be formed.

In the first embodiment shown in FIG. 1, the image pickup device is formed by providing the photoelectric conversion layers at three different positions in the depth direction of the p-type impurity region formed on the n-type semiconductor substrate, and the photoelectric conversion layers are insulated from each other. In FIG. 1, the image pickup device includes the first photoelectric conversion region 11 positioned at the smallest depth from the surface of the semiconductor, the second photoelectric conversion region 12 positioned under the first photoelectric conversion region 11, the third photoelectric conversion region 13 positioned under the second photoelectric conversion region 12, the p-type impurity region 14 for insulating the three photoelectric conversion regions 11, 12, and 13, and the n-type semiconductor substrate 15. Also, the three photoelectric conversion regions 11, 12, and 13 are connected to the surface of the semiconductor so as to be connected to the reading portion (not shown) for reading out a signal charge so that signal outputs corresponding to three different spectral sensitivities can be realized. A shielding unit is provided at the signal-charge reading portion so that light cannot enter this region.

In the first embodiment, the first photoelectric conversion region 11, which is positioned at the smallest depth from the surface of the semiconductor, is formed at a depth of 0.25 to 0.50 μm from the surface of the silicon substrate, the second photoelectric conversion region 12, which is positioned under the first photoelectric conversion region 11, is formed at a depth of 0.80 to 2.00 μm from the surface of the silicon substrate, and the third photoelectric conversion region 13, which is positioned under the second photoelectric conversion region 12, is formed at a depth of 2.50 to 5.00 μm from the surface of the silicon substrate.

Figure 4:
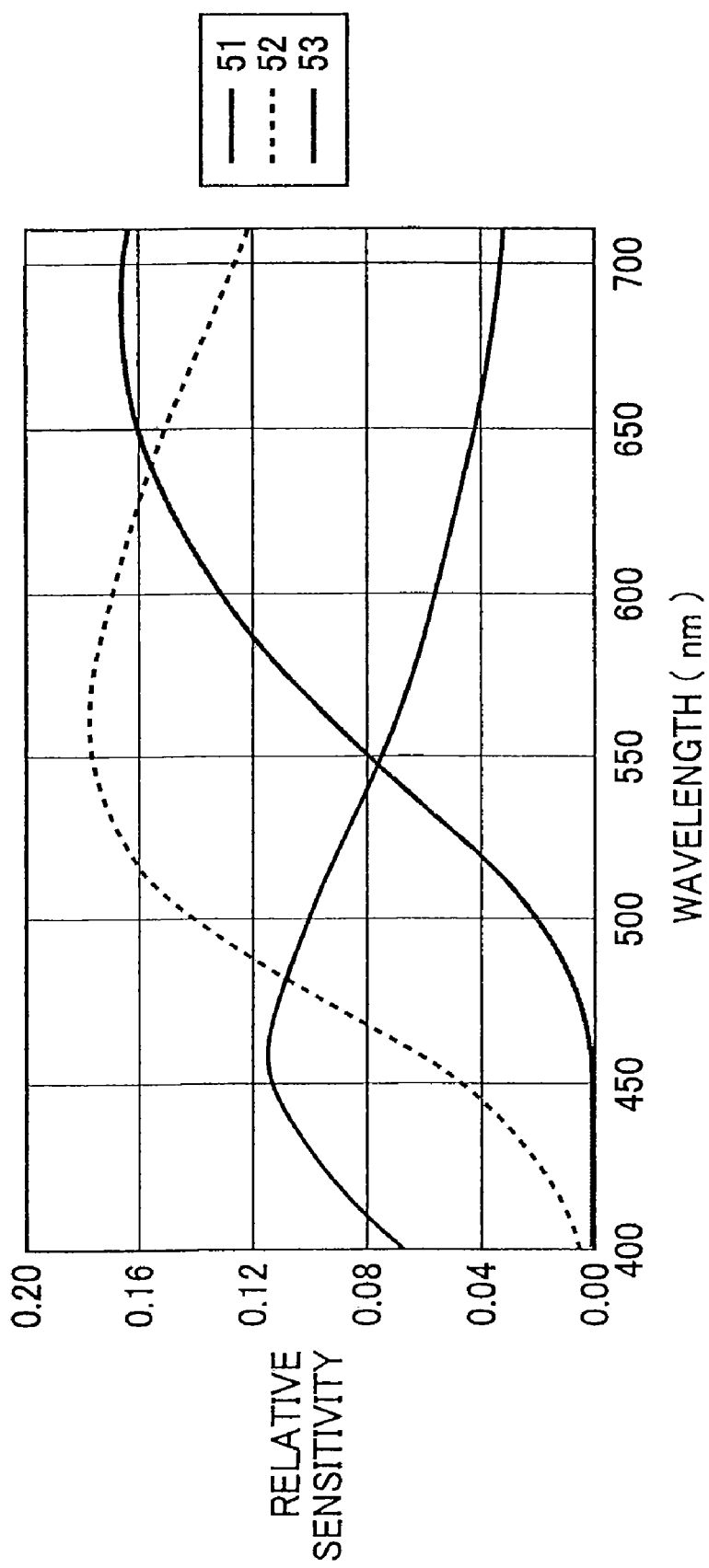
FIG. 4 shows the spectral sensitivities of photoelectric conversion signals of the image pickup device according to the first embodiment.

In the first embodiment, since the three photoelectric conversion regions are formed at different depths, the spectral sensitivities of the three photoelectric conversion signals shown in FIG. 4 can be obtained. In FIG. 4, 51 denotes the spectral sensitivity of a signal charge output from the first photoelectric conversion region 11, 52 denotes the spectral sensitivity of a signal charge output from the second photoelectric conversion region 12, and 53 denotes the spectral sensitivity of a signal charge output from the third photoelectric conversion region 13.

Figure 5:
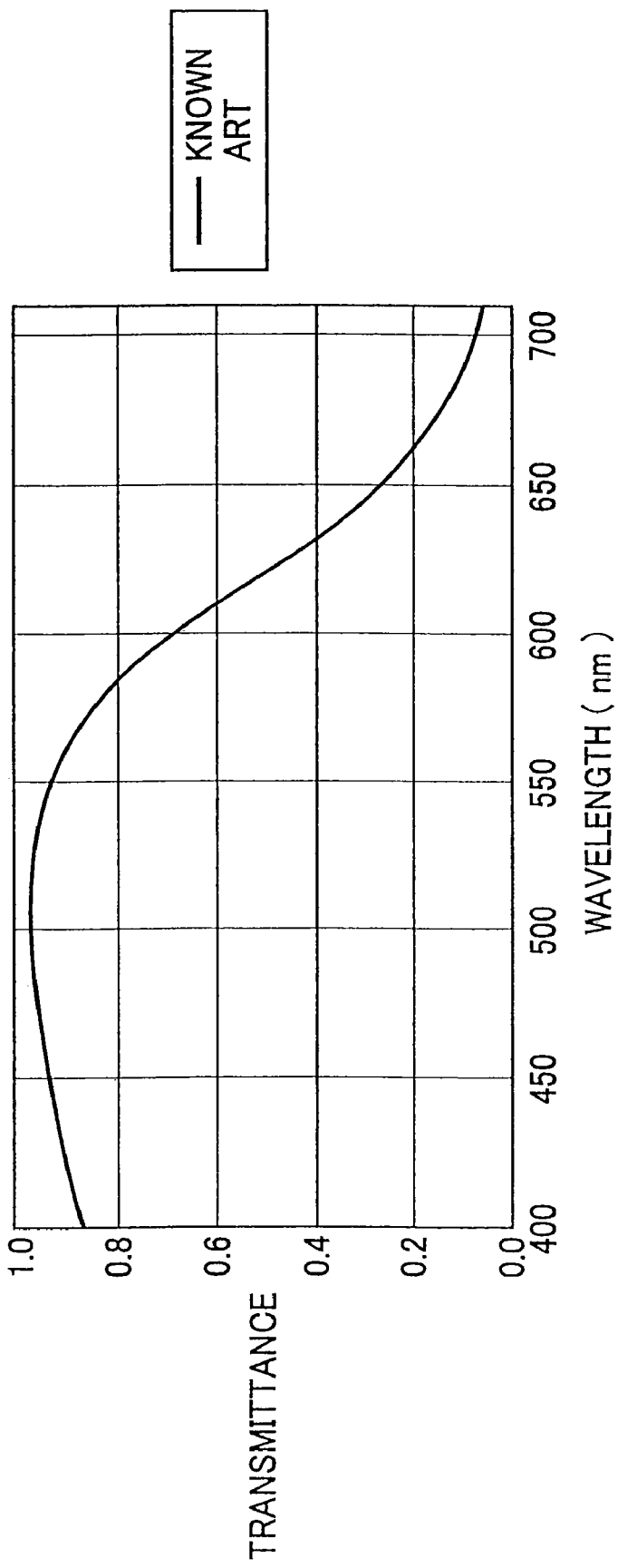
FIG. 5 shows the spectral transmittance characteristic of a known infrared-cut filter.

In a color image pickup device using the photoelectric converting function of silicon, an infrared-cut filter for blocking light in the infrared wavelength region is generally used in combination in order to obtain a spectral sensitivity similar to that of the human eye. FIG. 5 shows an example of the spectral sensitivity of an infrared-cut filter for absorbing light in the near infrared region. In this way, a method of forming a color signal by using a color filter which allows light in the range of 400 to 650 nm in the visible wavelength region to selectively pass therethrough and which is disposed for each pixel of the image pickup device and has a predetermined spectral characteristic is generally used. A color signal of an object is generated by using this method. Preferably, the generated color signal is similar to the color signal generated when a user views an object. Also, the spectral sensitivity of the color signal desirably has a sensitivity similar to the spectrum tristimulus values of the human eye.

Figure 6:
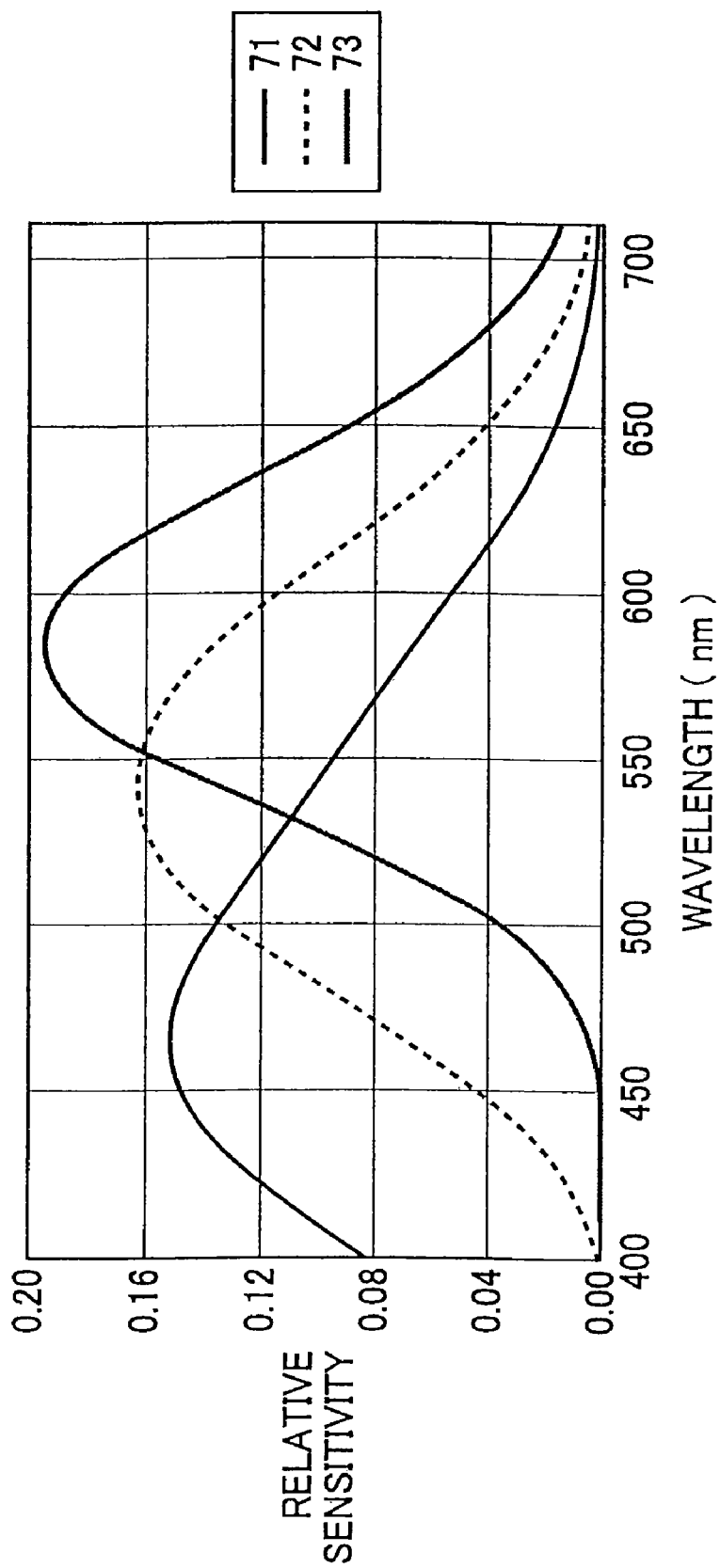
FIG. 6 shows the spectral sensitivities of photoelectric conversion signals when the image pickup device of the first embodiment and the known infrared-cut filter are used in combination.

When the spectral sensitivities of signal charges output from the three photoelectric conversion regions of the first embodiment and the infrared-cut filter having the spectral transmittance characteristic shown in FIG. 5 are used in combination, the spectral sensitivities of signal charges output from the three photoelectric conversion regions as shown in FIG. 6 can be obtained. The spectral sensitivities shown in FIG. 6 are normalized so that the total amount of charge is even. In FIG. 6, 71 denotes the spectral sensitivity of a signal charge output from the first photoelectric conversion region 11, 72 denotes the spectral sensitivity of a signal charge output from the second photoelectric conversion region 12, and 73 denotes the spectral sensitivity of a signal charge output from the third photoelectric conversion region 13.

Figure 7:
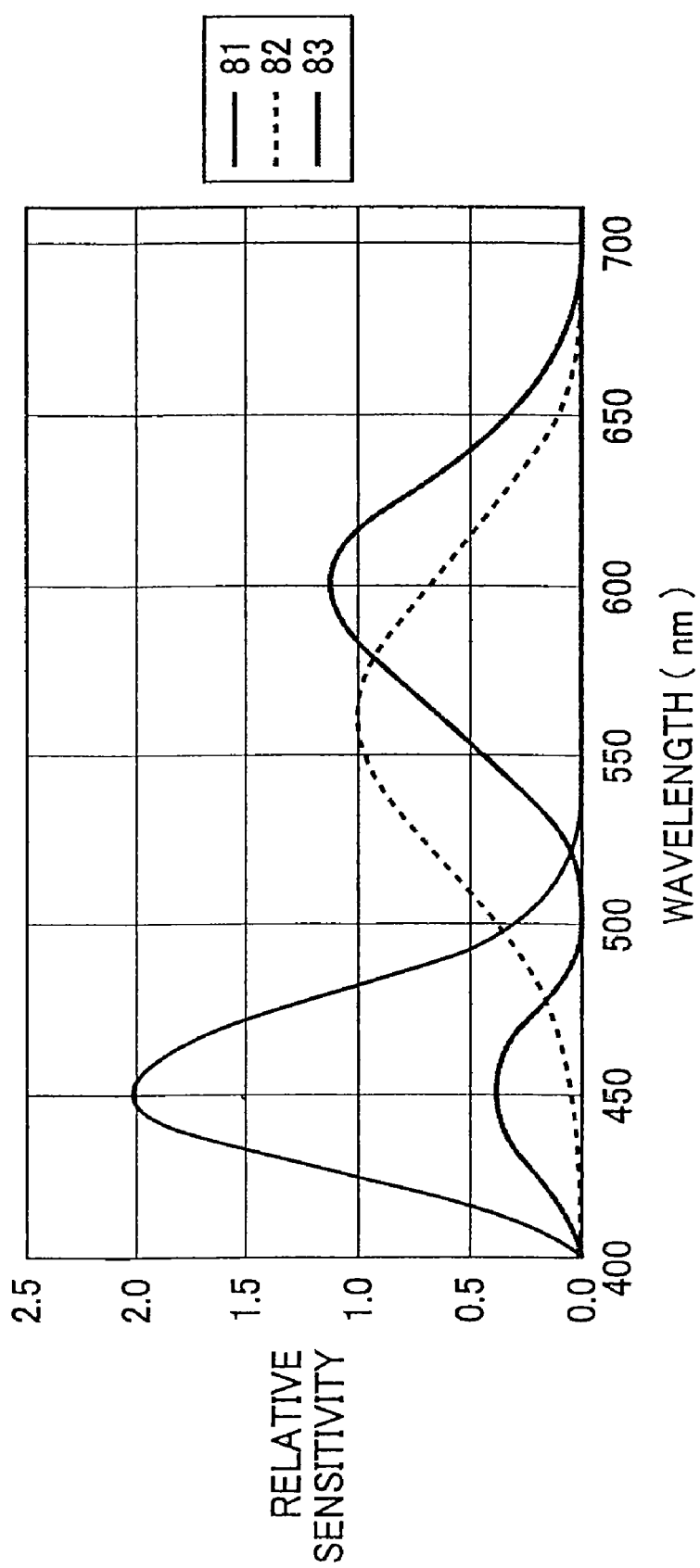
FIG. 7 shows the spectral sensitivities corresponding to the spectrum tristimulus values of the human eye.

On the other hand, it is known that the spectrum tristimulus values of the human eye have the characteristics shown in FIG. 7. In FIG. 7, 81 denotes the spectral sensitivity corresponding to blue, 82 denotes the spectral sensitivity corresponding to green, and 83 denotes the spectral sensitivity corresponding to red.

Comparing FIGS. 6 and 7, it can be found that the correlation between the spectral sensitivity 71 of output charge from the first photoelectric conversion region, which outputs a color signal of a particularly short wavelength and which is positioned at the position closest to the surface of the silicon substrate, and the spectral sensitivity 81 of the human eye for blue is poor. The major difference is that, in the spectral sensitivity 71 of the output charge, the relative sensitivity in a relatively long-wavelength region (for example, in the vicinity of 600 nm) in the visible wavelength region is quite high. This means that, even in a region close to the surface of the silicon substrate, the charge generated by light of a relatively long wavelength in the visible wavelength region reaches a substantial level.

Figure 8:
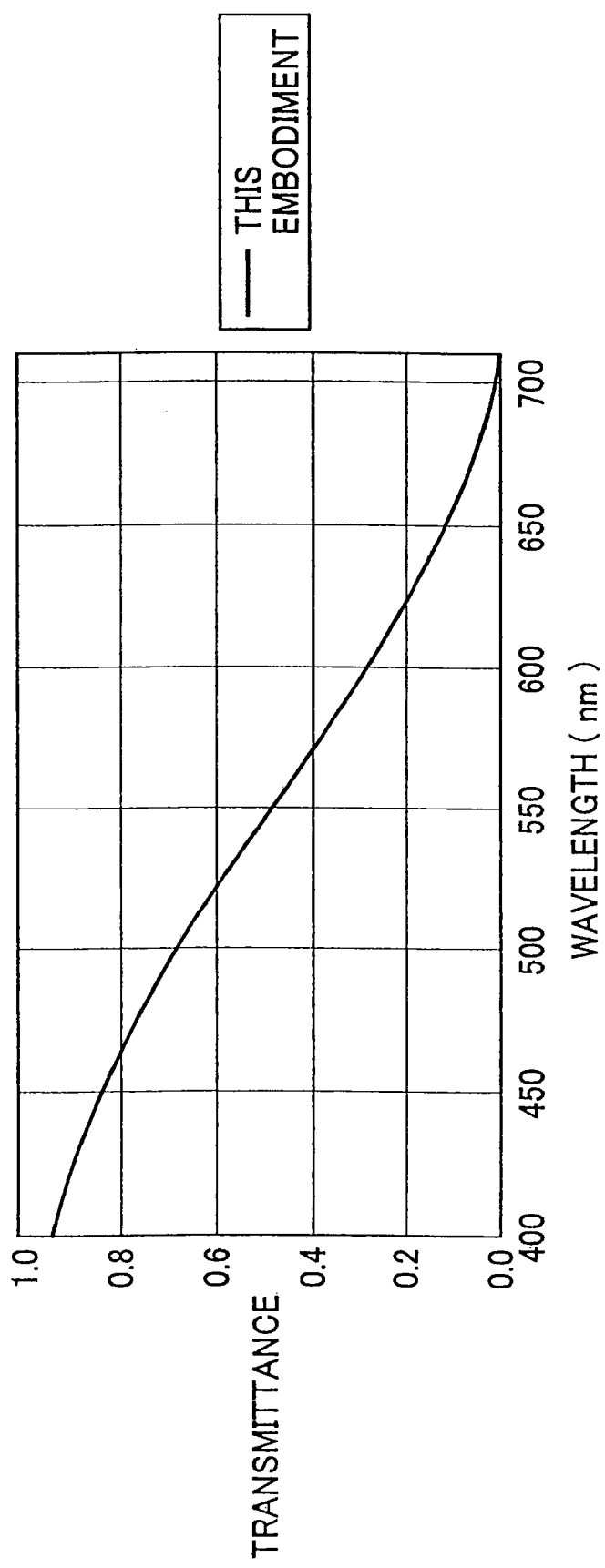
FIG. 8 shows the spectral transmittance characteristic of an optical filter according to the first embodiment.

In view of this situation, the optical filter according to the first embodiment is formed such that the filter has a characteristic in which the transmittance is sufficiently low with respect to the short wavelength region in the visible wavelength region, in the long wavelength region in the visible wavelength region. Accordingly, a favorable correlation with the spectral sensitivity 81 of the human eye for blue can be obtained. FIG. 8 shows the spectral transmittance characteristic of the optical filter of the first embodiment. As shown in FIG. 8, the optical filter of the first embodiment is formed so that the transmittance is 90% or more at a wavelength of 400 nm and that the transmittance gradually decreases as the wavelength increases. When the wavelength is 700 nm or more, which is in the infrared wavelength region, the transmittance is almost 0%. In this embodiment, the transmittance T1 at a wavelength of 450 nm, the transmittance T2 at a wavelength of 550 nm, and the transmittance T3 at a wavelength of 650 nm are set to the following values:

T1=0.81

T2=0.46

T3=0.11

Figure 9:
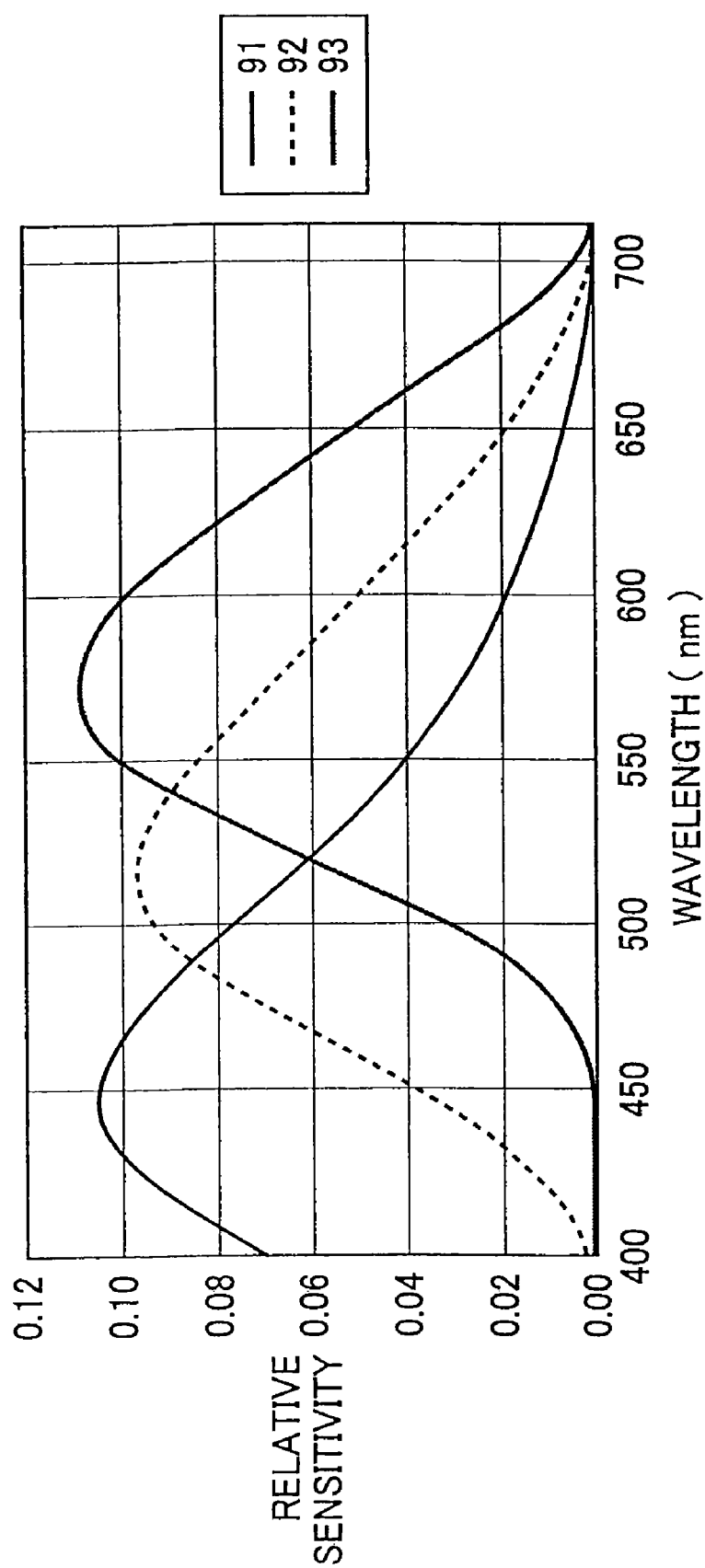
FIG. 9 shows the spectral sensitivities of photoelectric conversion signals when the image pickup device of the first embodiment and the optical filter of the first embodiment are used in combination.

When the spectral sensitivities of signal charges output from the three photoelectric conversion regions of this embodiment and the optical filter having the characteristic shown in FIG. 8 are used in combination, the spectral sensitivities of signal charges output from the three photoelectric conversion regions shown in FIG. 9 are obtained, the spectral sensitivities being normalized so that the total amount of the charge is even. In FIG. 9, 91 denotes the spectral sensitivity of a signal charge output from the first photoelectric conversion region 11, 92 denotes the spectral sensitivity of a signal charge output from the second photoelectric conversion region 12, and 93 denotes the spectral sensitivity of a signal charge output from the third photoelectric conversion region 13.

In the spectral sensitivities shown in FIG. 9, the correlation with the spectrum tristimulus values of the human eye shown in FIG. 7 is improved, compared with the spectral sensitivities shown in FIG. 6, in which the infrared-cut filter of the known art is used. In this embodiment, by using the optical filter having such a characteristic, a color signal having spectral characteristics which are more similar to the characteristic of the human eye can be output compared with the case where the infrared-cut filter of the known art is used. Accordingly, a color signal of an observed object can be favorably reproduced in an image.

The optical filter of this embodiment can be manufactured by evaporating a dielectric multilayer film on a transparent substrate. In order to sufficiently block light in the infrared wavelength region, a more preferable embodiment can be realized by combining a plurality of dielectric multilayer films having different characteristics. Of course, the infrared-cut filter having a characteristic of absorbing light in the infrared wavelength region of the known art can be used in combination with the optical filter including a dielectric multilayer film.

Second Embodiment

Figure 10:
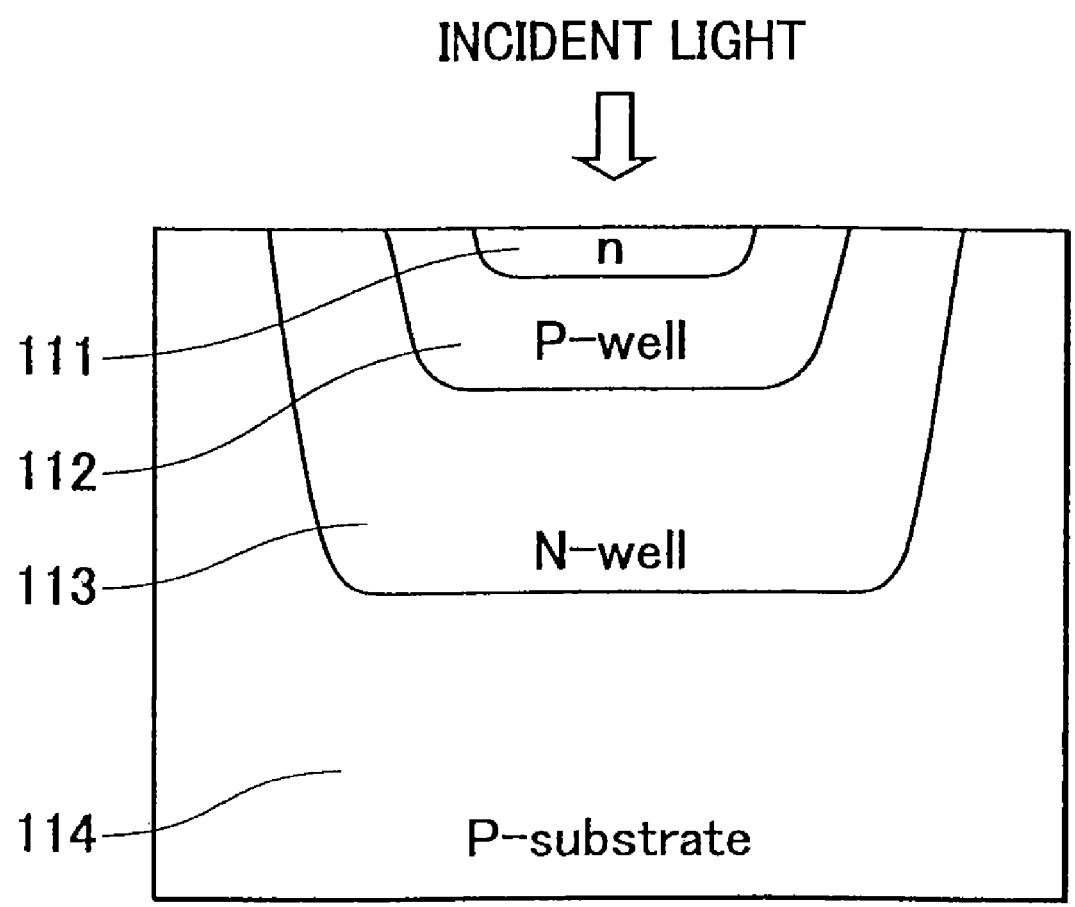
FIG. 10 is a cross-sectional view of an image pickup device according to a second embodiment.

FIG. 10 is a cross-sectional view showing an image pickup device forming an image pickup apparatus according to a second embodiment of the present invention. In the second embodiment, a two-dimensional image sensor of a three-layer photodiode structure is formed, in which a photodiode is formed in a triple-well structure. In this embodiment, the photodiode is formed by stacking an n-type layer, a p-type layer, and an n-type layer on the surface of a p-type silicon substrate in that order so that a pn-junction diode has three-layer photoelectric conversion regions formed in the depth direction of the silicon substrate. In FIG. 10, the image pickup device includes a first n-type layer 111 which is disposed at the smallest depth from the surface of the silicon substrate, a second p-type layer 112 which is disposed under the first n-type layer 111, and a third n-type layer 113 which is disposed under the second p-type layer 112, and a fourth layer 114 including a p-type substrate which is disposed at the most deepest position.

In the second embodiment, the border between the first n-type layer 111 and the second p-type layer 112 is positioned at a depth of 0.2 μm from the surface of the silicon substrate, the border between the second p-type layer 112 and the third n-type layer 113 is positioned at a depth of 0.6 μm from the surface of the silicon substrate, and the border between the third n-type layer 113 and the fourth layer 114 of the p-type substrate is positioned at a depth of 2.0 μm from the surface of the silicone substrate, whereby the distance between the surface of the silicon substrate and the bottom surface of the fourth layer 114 of the p-type substrate is 5.0 μm.

In this embodiment, a signal output is provided by adding or subtracting a negative charge or a positive charge output from each layer having the above-described configuration. As a result, the spectral characteristic of a signal which can be obtained from each layer is the same as in the above-described first embodiment. In the second embodiment, a signal corresponding to blue is calculated by an operation of extracting only the output signal of the second layer, a signal corresponding to green is calculated by an operation of extracting only the output signal of the second layer, and a signal corresponding to red is calculated by an operation of extracting only the output signal of the second layer.

Figure 11:
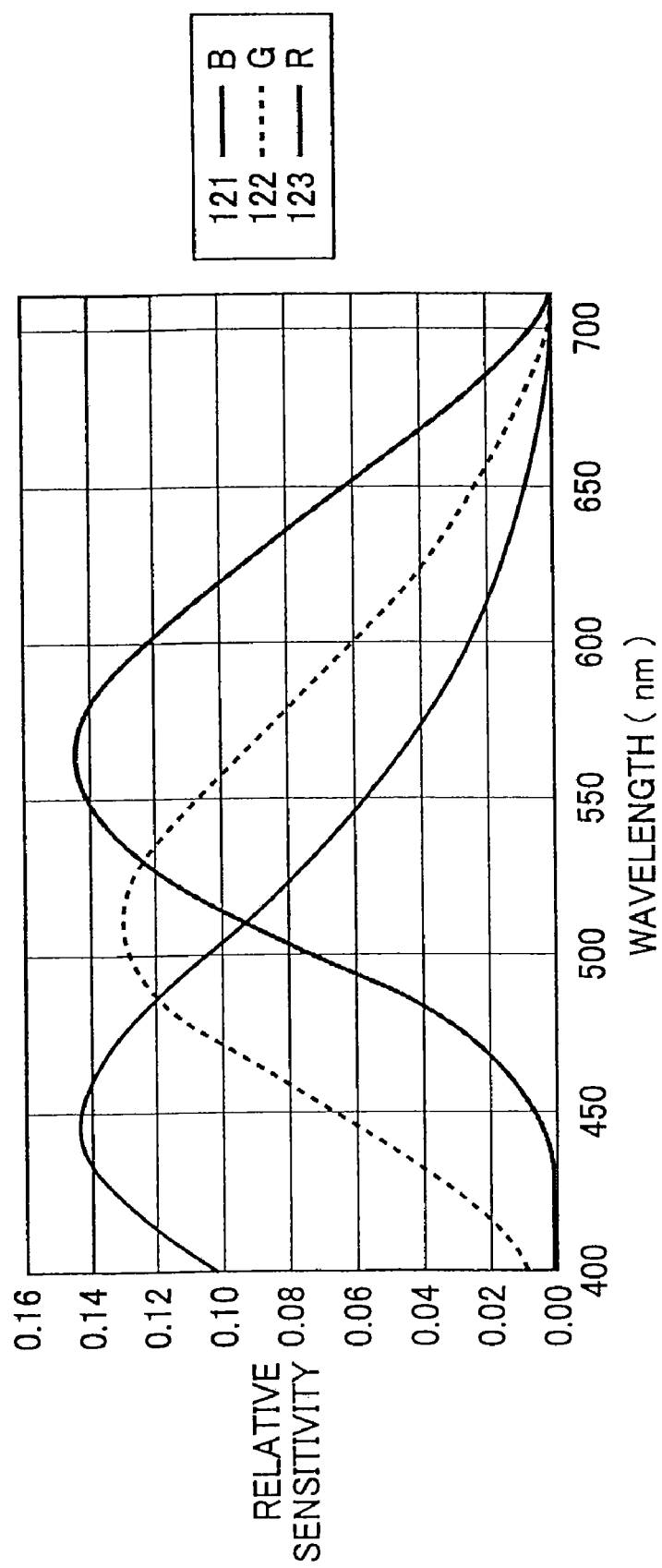
FIG. 11 shows the spectral sensitivities of photoelectric conversion signals when the image pickup device of the second embodiment and the optical filter of the first embodiment are used in combination.

When the image pickup device of this embodiment is used in combination with the optical filter having the characteristics shown in FIG. 8, the spectral sensitivities corresponding to the three color signals shown in FIG. 11 can be obtained. The spectral sensitivities shown in FIG. 11 are normalized so that the total amount of individual signals is even. In FIG. 11, 121 denotes the spectral sensitivity of a signal corresponding to blue, 122 denotes the spectral sensitivity of a signal corresponding to green, and 123 denotes the spectral sensitivity of a signal corresponding to red. In the second embodiment, too, by using the optical filter having the characteristics shown in FIG. 8, a color signal having the spectral characteristic similar to the characteristic of the human eye can be output.

As described above, according to the first and second embodiments, the image pickup apparatus forms a color image signal by using the image pickup device which has a plurality of photoelectric conversion layers which are disposed at different depths from the surface of the semiconductor substrate and which are electrically separated, and in which photoelectric conversion signals corresponding to different spectral sensitivities are output from one pixel. By using the optical filter having a new spectral transmittance characteristic together, a favorable spectral sensitivity characteristic of a photoelectric conversion signal output from each photoelectric conversion layer can be obtained so that the color of a taken image can be favorably reproduced.

Further, in the image pickup device of the present invention, the following problems can be overcome: a decrease in the resolving power of each color, which is a problem in a general color image pickup device using mosaic color filters; and generation of a false-color signal. Accordingly, color reproducibility can be improved and a favorable color image pickup apparatus can be realized.

Third Embodiment

Figure 12:
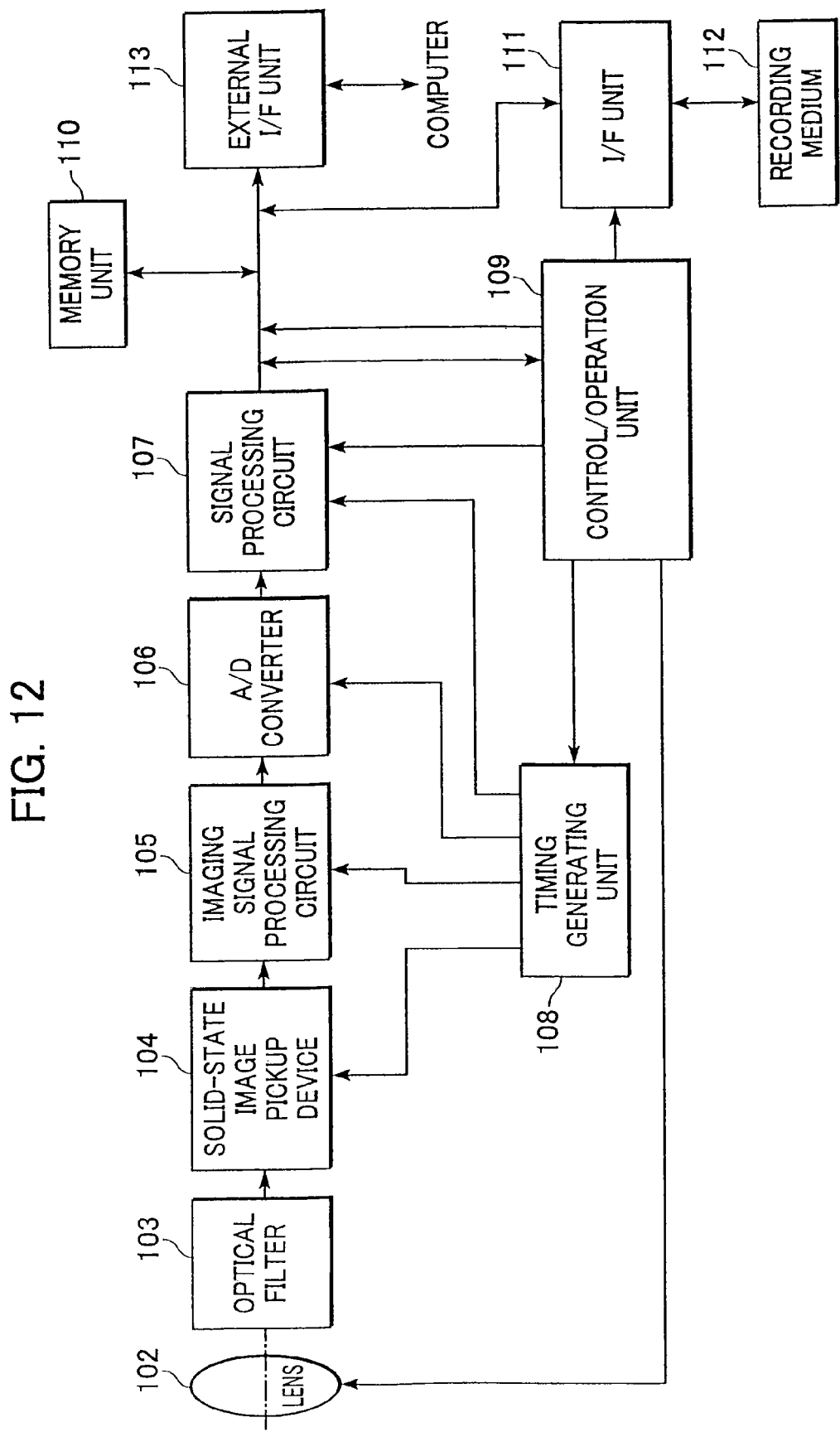
FIG. 12 shows an image pickup apparatus including the optical filter and the image pickup device according to the first and second embodiments.

FIG. 12 shows the entire configuration of the image pickup apparatus, in which the position of the optical filter with respect to the position of the image pickup device of the first and second embodiments and the other circuits are shown.

In FIG. 12, the image pickup apparatus includes a lens 102 used for forming the optical image of an object on a solid-state image pickup device 104; the optical filter 103 which has been described in the first and second embodiments; the solid-state image pickup device 104 which takes an object image formed by the lens 102 and passed through the optical filter 103 as an image signal and which includes a plurality of pixels, each pixel having a plurality of photoelectric conversion portions disposed in the depth direction of the semiconductor described in the first and second embodiments; an imaging signal processing circuit 105 including a gain variable amplifier unit for amplifying an image signal output from the solid-state image pickup device 104 and a gain correction circuit for correcting a gain value; an A/D converter 106 for A-D converting the image signal output from the solid-state image pickup device 104; a signal processing unit 107 for performing various corrections to the image data output from the A/D converter 106 and for compressing the data; a timing generating unit 108 for outputting various timing signals to the solid-state image pickup device 104, the imaging signal processing circuit 105, the A/D converter 106, and the signal processing unit 107; a control/operation unit 109 for performing various operations and controlling the entire still video camera, a memory unit 110 for temporarily storing the image data; an interface unit 111 for recording/reading data in/from a recording medium; a removable recording medium 112 which records or reads out the image data, such as a semiconductor memory; and an interface unit 113 used for communicating with an external computer or the like.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image pickup apparatus comprising:
an image pickup region of a solid-state image pickup device in which a plurality of pixels are arranged, each pixel including a plurality of photoelectric conversion portions disposed in the depth direction of a semiconductor;
an imaging signal processing circuit including a gain variable amplifier unit that amplifies an image signal output from the solid-state image pickup device and a gain correction circuit that collects a gain value of the gain variable amplifier unit; and
a filter which is disposed on the incident side of the image pickup region and which has a characteristic wherein the transmittance of light in the visible wavelength region decreases as the wavelength of light becomes longer, wherein the transmittance is at least 90% at a wavelength of 400 nm and continuously decreases from 400 nm to 700 nm so that with any increase in the wavelength in the range from 400 nm to 700 nm the transmittance decreases.

2. The image pickup apparatus according to claim 1, wherein $T1>0.7>T2>0.2>T3$ is satisfied when the transmittance of the filter at a wavelength of 450 nm is represented by T1, the transmittance at a wavelength of 550 nm is represented by T2, and the transmittance at a wavelength of 650 nm is represented by T3.

3. An image pickup apparatus comprising:
an image pickup region of a solid-state image pickup device in which a plurality of pixels are arranged, each pixel including a plurality of photoelectric conversion portions disposed in the depth direction of a semiconductor;
an imaging signal processing circuit including a gain variable amplifier unit that amplifies an image signal output from the solid-state image pickup device and a gain correction circuit that corrects a gain value of the gain variable amplifier unit; and
a filter which is disposed on the incident side of the image pickup region and which has a characteristic wherein the transmittance of light having a wavelength of 450 to 650 nm decreases as the wavelength of light becomes longer the transmittance is at least 90% at a wavelength of 400 nm and continuously decreases from 400 nm to 700 nm so that with any increase in the wavelength in the range from 400 nm to 700 nm the transmittance decreases.

4. The image pickup apparatus according to claim 3, wherein $T1>0.7>T2>0.2>T3$ is satisfied when the transmittance of the filter at a wavelength of 450 nm is represented by T1, the transmittance at a wavelength of 550 nm is represented by T2, and the transmittance at a wavelength of 650 nm is represented by T3.

* * * * *